(12) United States Patent
Digonnet et al.

(10) Patent No.: US 10,790,633 B2
(45) Date of Patent: Sep. 29, 2020

(54) ANTI-STOKES-FLUORESCENCE-COOLED FIBER-BASED GAIN ELEMENT

(71) Applicant: The Board of Trustees of the Leland Stanford Junior University, Stanford, CA (US)

(72) Inventors: Michel J. Digonnet, Stanford, CA (US); Jennifer Knall, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/541,015

(22) Filed: Aug. 14, 2019

(65) Prior Publication Data

US 2020/0059063 A1 Feb. 20, 2020

Related U.S. Application Data

(60) Provisional application No. 62/764,750, filed on Aug. 15, 2018, provisional application No. 62/764,899, (Continued)

(51) Int. Cl.
*G02B 6/02* (2006.01)
*H01S 3/094* (2006.01)
(Continued)

(52) U.S. Cl.
CPC .... *H01S 3/094053* (2013.01); *H01S 3/06733* (2013.01); *H01S 3/06754* (2013.01); *H01S 3/094007* (2013.01); *H03G 3/30* (2013.01)

(58) Field of Classification Search
CPC ... G02B 6/02; H01S 3/06754; H01S 3/06733; H01S 3/094053; H01S 3/094007
See application file for complete search history.

(56) References Cited

U.S. PATENT DOCUMENTS 6,841,092 B2 1/2005 Paeschke et al.
6,959,022 B2 10/2005 Sandrock et al.
(Continued)

OTHER PUBLICATIONS

Galina Nemova et al., "Fiber amplifier with integrated optical cooler", "The Journal of the Optical Society of America", Dec. 1, 2009, pp. 2237-2241, vol. 26, No. 12.
(Continued)

*Primary Examiner* — Jennifer Doan
(74) *Attorney, Agent, or Firm* — Kaplan Breyer Schwarz, LLP

(57) ABSTRACT

Fiber-based gain elements, such as fiber lasers, fiber amplifiers, and the like, that have higher power and better frequency stability than can be achieved in the prior art are presented. Embodiments include a fiber-based gain element having a first portion in which anti-Stokes fluorescence (ASF) reduces its temperature below that of an ambient environment and a second portion whose temperature is not reduced below that of the ambient environment, which are thermally coupled so heat can flow from the second portion into the first portion, thereby reducing the average temperature of the gain element. In some embodiments, a core configured to provide optical gain is thermally coupled with a first cladding configured to exhibit ASF cooling via an intervening cladding layer that acts to confine a first pump signal to the core.

22 Claims, 7 Drawing Sheets

Related U.S. Application Data filed on Aug. 16, 2018, provisional application No. 62/719,258, filed on Aug. 17, 2018.

(51) Int. Cl.
 *H03G 3/30* (2006.01)
 *H01S 3/067* (2006.01)

(56) References Cited

U.S. PATENT DOCUMENTS

| | | | |
|---|---|---|---|
| 8,542,971 B2* | 9/2013 | Chatigny | G02B 6/3636 385/134 |
| 8,755,660 B1* | 6/2014 | Minelly | C03B 37/0122 385/126 |
| 9,645,310 B2 | 5/2017 | Ishaaya et al. | |

OTHER PUBLICATIONS

Galina Nemova et al., "High-power fiber lasers with integrated rare-earth optical cooler", "Proceedings of SPIE", Feb. 18, 2010, Proc. SPIE 7614, Laser Refrigeration of Solids III, doi: 10.1117/12.840752, 11 pp., vol. 7614.

Galina Nemova et al., "Raman Fiber Amplifier With Integrated Cooler", "Journal of Lightwave Technology", Dec. 15, 2009, Publisher: IEEE, Digital Object Identifier 10.1109/JLT.2009.2033390, pp. 5597-5601, vol. 27, No. 24.

Galina Nemova et al., "Yb3+-doped fiber laser with integrated optical cooler", "Proceedings of SPIE", doi: 10.1117/12.849835, 7 pp., vol. 7686, http://proceedings.spiedigitallibrary.org/.

Galina Nemova, "Laser cooling of solids", Jul. 1, 2010, Ecole Polytechnique de Montreal, Canada, 26 pp.

* cited by examiner

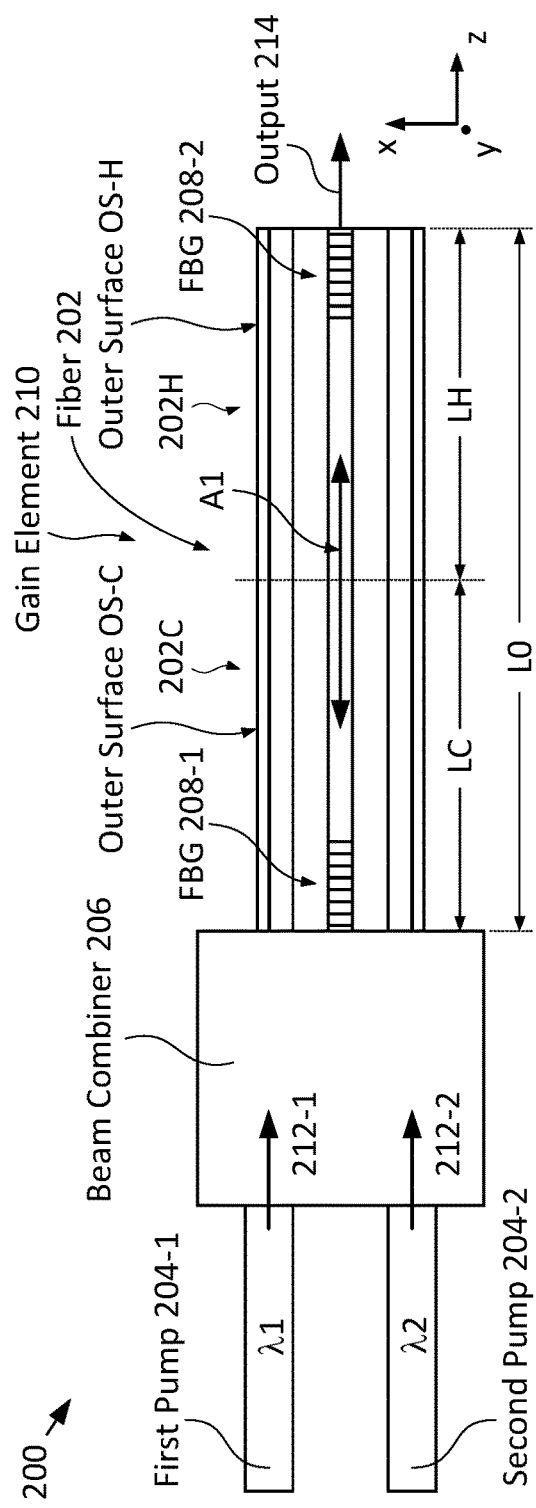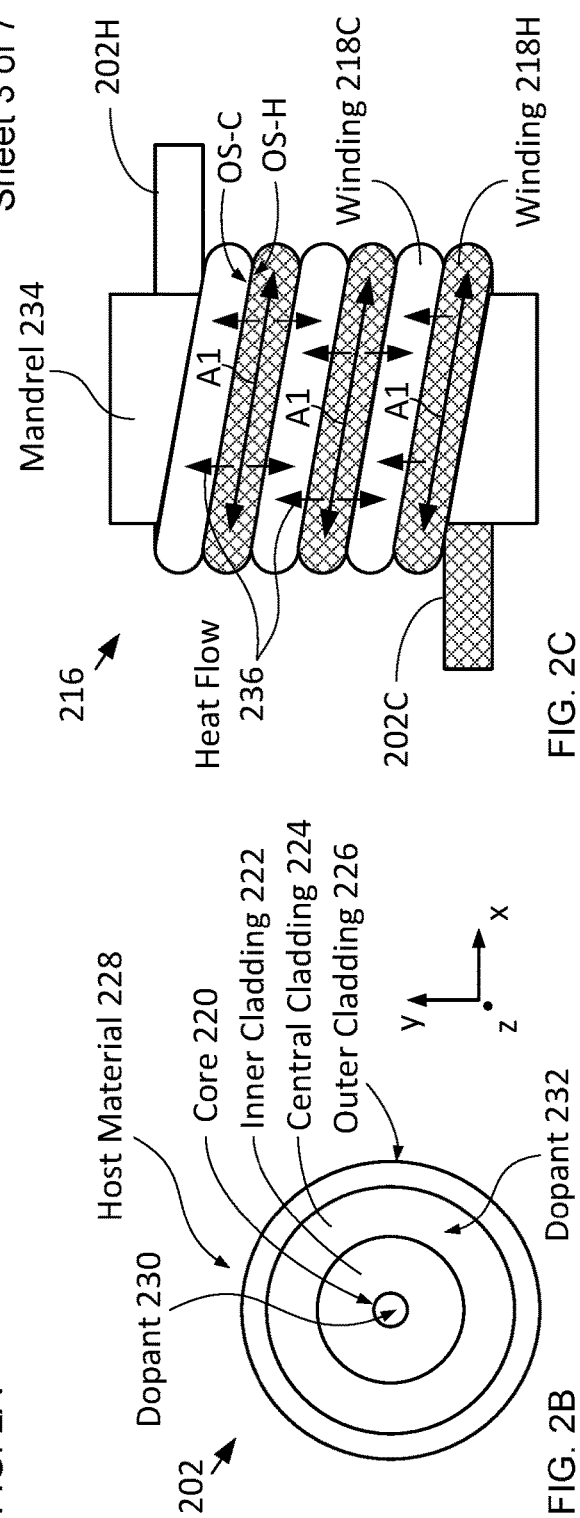

300

ANTI-STOKES-FLUORESCENCE-COOLED FIBER-BASED GAIN ELEMENT

RELATED APPLICATIONS

This application claims the benefit of U.S. Provisional Application Nos. 62/764,750, filed Aug. 15, 2018, 62/764,899, filed Aug. 16, 2018, and 62/719,258, filed Aug. 17, 2018, each of which is incorporated herein by reference.

STATEMENT REGARDING FEDERALLY SPONSORED RESEARCH

This invention was made with Government support under Grant Number: FA9550-16-1-0383, awarded by the Air Force Office of Scientific Research. The Government has certain rights in the invention.

TECHNICAL FIELD

The present disclosure relates to optics in general, and, more particularly, to optical-fiber lasers and optical-fiber amplifiers.

BACKGROUND

Optical fibers whose cores are doped with one or more active dopants (i.e., dopants that enable optical gain, such as rare-earth ions, etc.) have found widespread use as optical-gain-providing elements, such as fiber lasers and fiber amplifiers. Optical gain in such a device is often realized by "optical pumping," wherein a "pump signal," having a pump wavelength that is shorter than the lasing wavelength, is injected into the core material.

Unfortunately, a quantum defect between the pump wavelength and the laser wavelength gives rise to internal heat generation that can lead to thermal damage or even melting of the gain material, laser frequency instabilities through thermal-focusing and other effects, increased relative-intensity noise, etc. As a result, this internal heat generation has, to date, limited the maximum output optical power that optical-fiber-based gain elements can provide.

Prior-art methods for cooling optical-fiber-based gain elements to mitigate the effects of this internally generated heat include the use of external coolers that circulate air or water around the laser gain medium. Unfortunately, this adds bulk, complexity, and cost to the devices. In addition, external coolers are thermally coupled to the outer surface of the gain medium. As a result, they induce thermal gradients through the bulk of the gain material that affect the quality of the output mode, among other issues. Furthermore, external coolers have potential water or coolant leaks, which can cause significant damage to associated devices and/or equipment. Finally, cooling systems tend to have fast moving parts, like flowing fluids and mechanical pumps, that can give rise to vibration that can cause amplitude and frequency noise in the laser or amplifier output.

Alternative prior-art approaches employ thermo-electric coolers based on the Peltier effect. While thermo-electric coolers are generally vibration-free, they consume a significant amount of energy. In addition, because of their relatively large mass, they cannot cool objects down to very low temperatures. Like coolers that circulate a cooling fluid, they also cool from the surface of the gain medium, which creates undesirable thermal gradients through its bulk.

The need for a simple, low-cost approach for cooling fiber lasers and fiber amplifiers to enable them to provide high levels of optical power remains, as yet, unmet by prior-art approaches.

SUMMARY

The present disclosure enables high-power fiber-based gain elements, such as fiber lasers, fiber amplifiers, and fiber laser/amplifier combinations, without some of the costs and disadvantages of the prior art. Embodiments in accordance with the present disclosure include an optical fiber configured to exhibit optical gain, where the optical fiber includes at least one portion that is colder than a first temperature, such as that of an ambient environment, due to anti-Stokes fluorescence cooling and at least one other portion that is hotter than the first temperature due to a lack of sufficient anti-Stokes fluorescence cooling. In each embodiment, the optical fiber is arranged such that at least some of the hot portion is thermally coupled with at least some of the cold portion so that heat is drawn from the hot portion and transferred to the cold portion, thereby lowering the temperature gradient along the fiber. As a result, gain elements in accordance with the present disclosure can achieve higher optical output powers and the frequency instabilities and damage that can occur due to internal heat generation are mitigated.

An illustrative embodiment of the present disclosure is a fiber-based gain element configured as a fiber laser having a continuous fiber that includes a hot portion and a cold portion. The fiber is arranged such that it defines a coil comprising a plurality of windings wrapped about a mandrel, where some of the windings are sections of the hot portion (i.e., hot windings) and some of the windings are sections of the cold portion (i.e., cold windings). The hot windings and cold windings are interleaved along the length of the mandrel such that each hot winding is thermally coupled with at least one cold winding. As a result, at least some of the internally generated heat within each hot winding is drawn out of the hot winding by a cold winding, thereby reducing the temperature of the hot winding. In some embodiments, thermally conductive material, such as thermal grease, is included to improve the thermal conductivity between the hot and cold windings. In some embodiments, the heat drawn from the hot winding increases the temperature of the cold winding such that the average temperature excursions from the first temperature are reduced.

In the illustrative embodiments, the gain element has an optical fiber structure that includes a central core surrounded by three concentric claddings—an inner cladding, a central cladding, and an outer cladding. The host material of the core is doped with a rare-earth element and is pumped with a first pump signal having a first pump wavelength that induces optical gain in the core. The host material of the inner cladding is undoped with rare-earth ions. The host material of the central cladding is doped with the same rare-earth element as the core and is pumped with a second pump signal having a second pump wavelength that induces anti-Stokes fluorescence in the central cladding. The central cladding has a refractive index that enables it to substantially confine the first pump signal to the inner cladding. The host material of the outer cladding is also undoped with rare-earth ions and has a refractive index that enables it to substantially confine the second pump signal to the central cladding. The anti-Stokes fluorescence cooling in the central cladding extracts a significant amount of heat from the central cladding, which, in turn, cools the entire fiber structure. In some embodiments, the core and central cladding are doped with different rare-earth elements. In some embodiments, the first and second pump signals have the same wavelength.

In some embodiments, a fiber-based gain element has a different arrangement, such as multi-layer, close-packed coil arrangements, helical arrangements, twisted arrangements, and the like.

In some embodiments, the fiber-based gain element is configured as a different gain element, such as a fiber amplifier, a fiber laser/amplifier combination, etc.

In some embodiments, the fiber structure includes a rare-earth-doped core that is surrounded by only two concentric claddings, where the inner cladding is doped with a rare earth that enables anti-Stokes fluorescence and the outer core is undoped with rare-earth ions.

In some embodiments, the host material of at least one of the core and claddings comprises a fluoride glass, such as zirconium barium lanthanum aluminum sodium fluoride (ZBLAN), zirconium barium lanthanum aluminum sodium lead fluoride (ZBLANP), and the like.

In some embodiments, a first pump is used to induce optical gain in the core, while a pair of second pumps are coupled into the opposite ends of the fiber to induce anti-Stokes fluorescence cooling in the cladding.

In some embodiments, a single pump is used to simultaneously induce optical gain in the core and ASF cooling in the doped cladding.

In some embodiments, a pair of first pumps are coupled into opposite ends of the fiber to simultaneously induce optical gain in the core and ASF cooling in the doped cladding.

In some embodiments, the fiber-based gain element is optically coupled with a beam combiner configured to introduce the pump signals into their respective guiding structures.

An embodiment in accordance with the present disclosure is a fiber-based gain element comprising an optical fiber having a longitudinal axis, a first portion having a first outer surface, and a second portion having a second outer surface, the optical fiber including: a core configured to provide optical gain in response to a first pump signal; and a first cladding that surrounds at least a portion of the core, the first cladding configured to exhibit anti-Stokes fluorescence (ASF) in response to a second pump signal, wherein the ASF removes heat from the first cladding; wherein the optical fiber is arranged such that the first outer surface and the second outer surface are thermally coupled; and wherein, when the core receives the first pump signal and the first cladding receives the second pump signal: (i) the first cladding and core are a thermally coupled such that heat can flow from the core into the first cladding; (ii) the first portion has a temperature that is lower than a first temperature and a second portion having a temperature that is higher than the first temperature; and (iii) heat can flow from the second portion to the first portion through the first and second surfaces along a direction that is unaligned with the longitudinal axis.

Another embodiment in accordance with the present disclosure is a method comprising: providing a fiber-based gain element comprising an optical fiber having a longitudinal axis, the optical fiber including a first portion having a first outer surface and a second portion having a second outer surface, the optical fiber comprising: (i) a core that is configured to provide optical gain in response to a first pump signal; and (ii) a first cladding that is configured to exhibit anti-Stokes fluorescence (ASF) in response to a second pump signal, wherein the first cladding is configured such that the ASF removes heat from the first cladding; wherein the first cladding and core are thermally coupled such that heat can flow from the core into the first cladding when the core receives the first pump signal and the first cladding receives the second pump signal; arranging the optical fiber in a first arrangement in which the first outer surface and second outer surface are thermally coupled and heat can flow between the first portion and second portion through the first and second outer surfaces along a direction that is unaligned with the longitudinal axis when the core receives the first pump signal and the first cladding receives the second pump signal; optically coupling the first pump signal into the core; and optically coupling the second pump signal into the first cladding.

BRIEF DESCRIPTION OF THE DRAWINGS

FIG. 2A depicts a schematic drawing of a cross-sectional view of a cladding-pumped fiber laser in accordance with the present disclosure.

FIG. 2B depicts a schematic drawing of a cross-sectional view of fiber 202.

FIG. 2C depicts a schematic drawing of a side view of a coiled fiber-laser configuration suitable for mitigating temperature excursions along the length of a fiber-based gain element in accordance with the present disclosure.

DETAILED DESCRIPTION

Principle of Anti-Stokes Fluorescence Cooling

Anti-Stokes fluorescence (ASF) is a well-known phenomenon wherein excitation of fluorescence in certain materials can be used to draw energy from the material in the form of heat, and dissipate that heat away from the material in the form of fluorescence to cool the material.

Figure 1A:
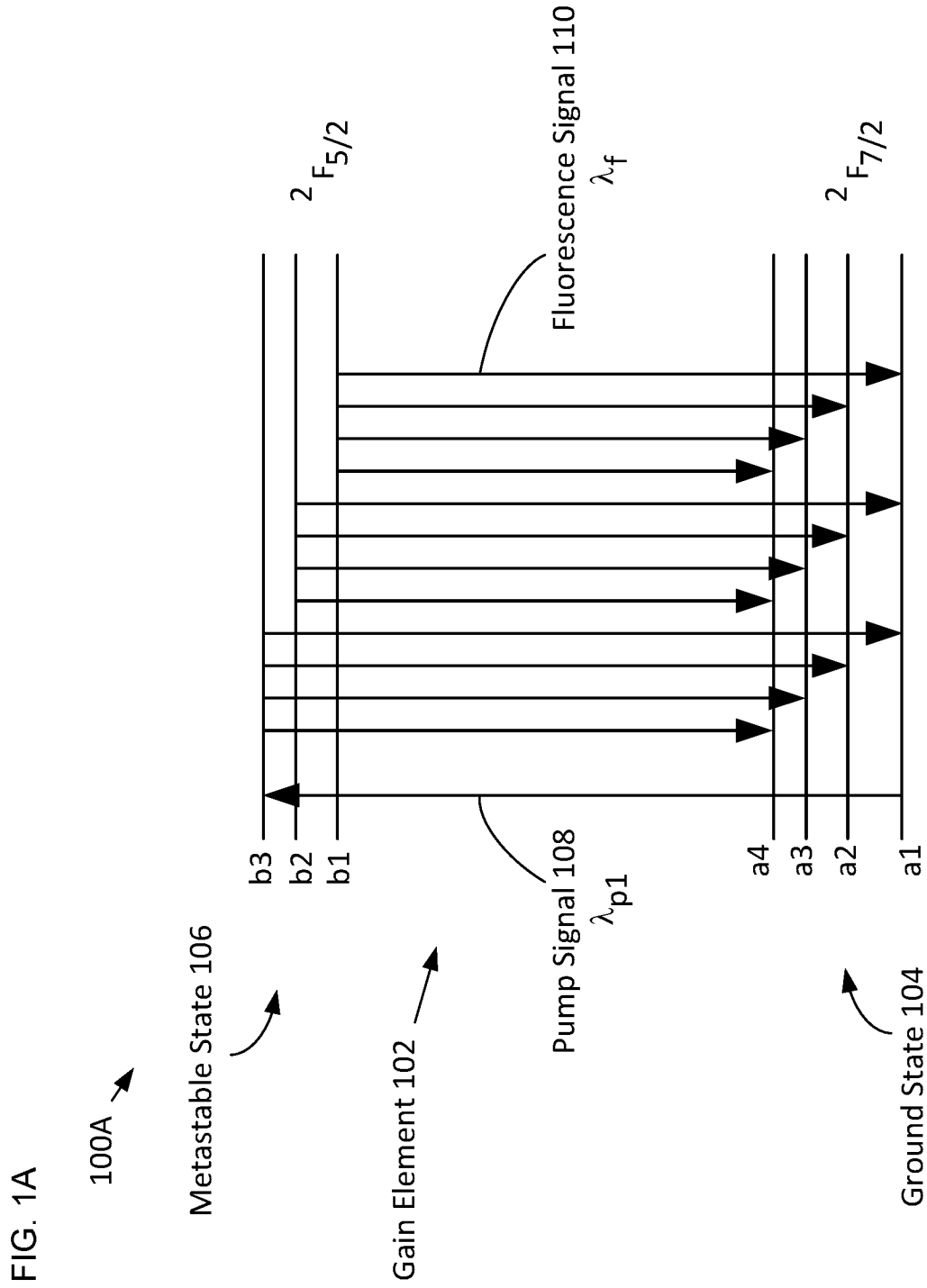
FIGS. 1A-B depict simplified energy-level diagrams for a fiber-based gain element pumped with pump signals having photon energies suitable for inducing conventional Stokes pumping and anti-Stokes fluorescence cooling, respectively.
Figure 1B:
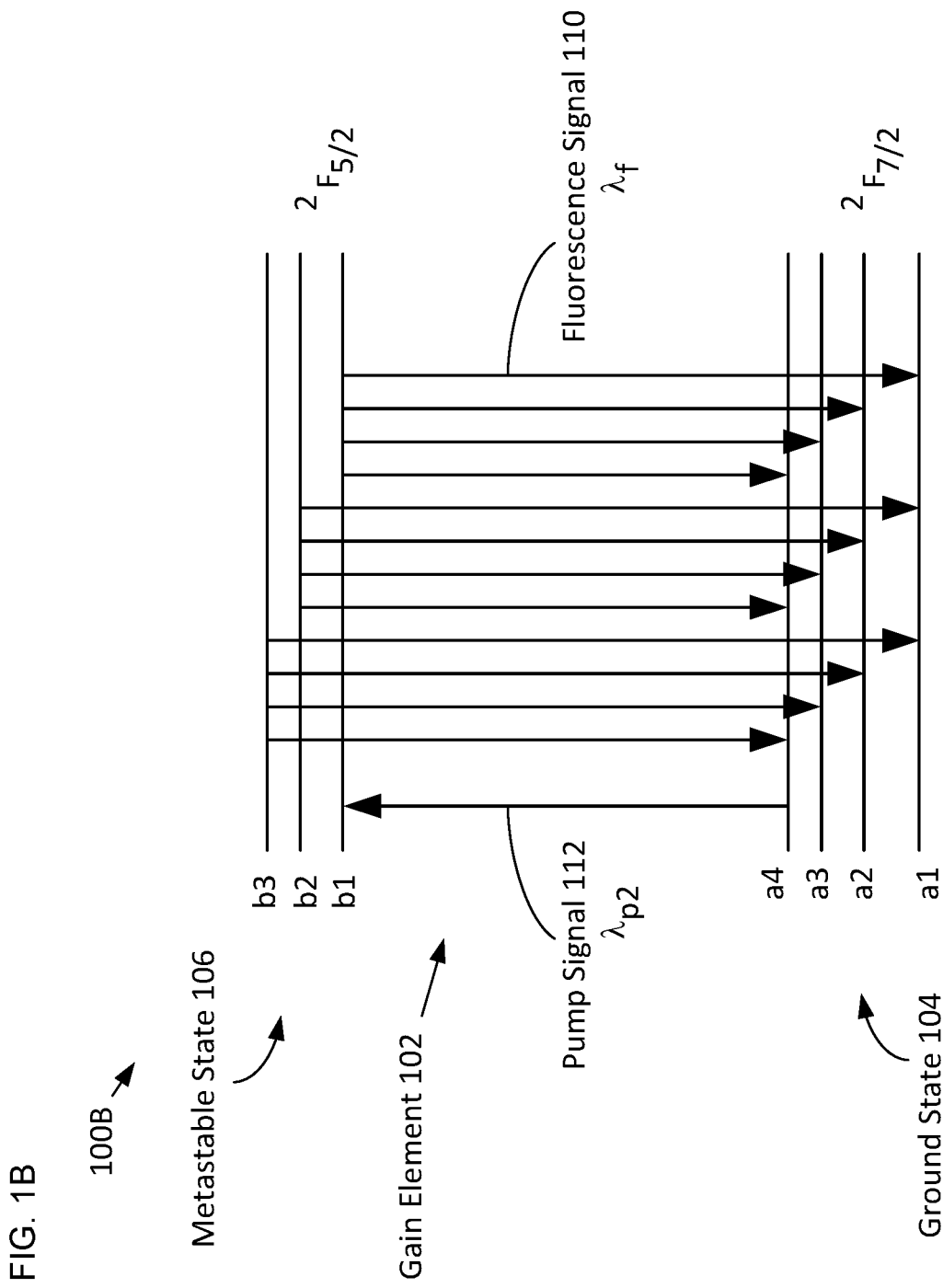

FIGS. 1A-B depict simplified energy-level diagrams for a fiber-based gain element pumped with pump signals having photon energies suitable for inducing conventional Stokes pumping and anti-Stokes fluorescence cooling, respectively. Plot 100A depicts energy-state transitions associated with conventional Stokes pumping, while plot 100B depicts energy-state transitions associated with anti-Stokes fluorescence cooling.

Gain element 102 is a rare-earth-doped optical fiber suitable for use as a fiber laser, fiber-amplifier, or fiber laser/amplifier combination. Gain element 102 has at least two primary energy levels—a ground state and a metastable state, each of which may include one or more sub-levels within it. In the depicted example, gain element 102 includes a host material of zirconium barium lanthanum aluminum sodium fluoride (ZBLAN), which is doped with an active dopant of trivalent ytterbium $Yb^{3+}$. Trivalent ytterbium has two manifold states—ground state 104 ($^2F_{7/2}$) and metastable state 106 ($^2F_{5/2}$), which are separated by approximately 10000 $cm^{-1}$ (approximately 1 micron in wavelength). Each of these manifold states has multiple energy sub-levels within it. Specifically, ground state 104 includes four energy sub-levels (i.e., a1 through a4) and metastable state 106 includes three energy sub-levels (i.e., b1 through b3).

The photon energy, $h_{vp}$, of a pump signal is related to its pump wavelength according to the equation $h_{vp} = hc/\lambda_p$, where h is Planck's constant and $_{vp}$ the photon frequency.

Plot 100A shows a simplified energy-level diagram for a fiber-based gain element doped with trivalent ytterbium $Yb^{3+}$ when pumped with pump signal 108. Pump signal 108 has photon energy $h_{vp1}$, which is substantially equal to the energy difference between the lowest sub-level of its ground state (i.e., sub-level a1) and the highest sub-level of its metastable state (i.e., sub-level b3).

In response to excitation by pump signal 108, electrons excited to the highest level of the metastable state will cascade down through the sub-levels of the excited metastable state until the electron distribution among these levels satisfies Boltzmann's distribution. In the process, energy lost by the electrons manifests as internally generated heat within the host material of the optical fiber. At the same time, electrons in the sub-levels of the ground state move among the sub-levels of the ground state to satisfy Boltzmann's distribution and also generate heat.

As electrons in sub-levels b1 through b3 spontaneously relax back to any of sub-levels a1 through a4, they emit one photon each time a transition is made, generating fluorescence signal 110 having wavelength $\lambda_f$.

Plot 100B depicts the same gain element when pumped with pump signal 112. Pump signal 112 has photon energy $h_{vp2}$, which is substantially equal to the energy difference between the highest energy sub-level of ground state 104 (i.e., sub-level a4) and the lowest energy sub-level of metastable state 106 (i.e., sub-level b1). In response to excitation by pump signal 108, electrons excited to sub-level b1 cascade upward through the sub-levels of metastable state 106 until the electron distribution among these sub-levels satisfies Boltzmann's distribution. As they cascade upward, the electrons acquire energy from phonons in the host material of the fiber, thereby cooling this material. Similarly, the electrons in the sub-levels of ground state 104 cascade upward through the sub-levels until their distribution among sub-levels a1 through a4 satisfies Boltzmann's distribution. In the process, these electrons also acquire energy from the phonons in the host material, thereby cooling it.

As in the system depicted in plot 100A, as electrons excited into any of sub-levels b1 through b3 spontaneously relax back to any of sub-levels a1 through a4, they emit one photon each time a transition is made, generating fluorescence signal 110 having wavelength $\lambda_f$.

In contrast to the system depicted in plot 100A, however, the mean photon energy of fluorescence signal 110 is greater than the photon energy of pump signal 112. When pumped with pump signal 112, therefore, more energy can leave the fiber in the form of fluorescence than entered in the form of pump power. As a result, pump signal 112 enables the fiber to be cooled. To achieve cooling through ASF, therefore, a gain material must therefore be pumped at a pump wavelength that is longer than the mean fluorescence wavelength $\langle \lambda_f \rangle$ of the material.

The maximum reduction in the temperature of a fiber-based gain element via ASF cooling is determined by the maximum amount of heat per unit length and time that can be removed from it. For a fiber with negligible background absorptive loss, maximum heat extraction is asymptotically achieved as the pump power approaches infinity and can be described as:

$$\left(\frac{dQ}{dt}\right)_{max} = \left(\frac{\tau_{rad}}{\tau(N_o)} h\nu_p - h\langle\nu_f\rangle\right) \frac{\sigma_p^a}{\sigma_p^a + \sigma_p^e} \frac{A_c}{\tau_{rad}} N_0 \quad (1)$$

where $\tau_{rad}$ is the radiative lifetime of the metastable state of the cooling ions, $\tau(N_0)$ is the total lifetime of the cooling ions including such effects as concentration quenching and nonradiative relaxation, $N_0$ is the ion concentration, $h\langle\nu_f\rangle$ is the mean energy of the fluorescence photons, $\sigma_p^a$ and $\sigma_p^e$ are the absorption and emission cross-section of the laser ion at the pump wavelength, respectively, and $A_c$ is the area of the doped region (often the core). The lifetime $\tau(N_0)$ depends on the concentration through the quenching effect. Quenching is caused by energy transfer from an excited cooling ion to an impurity such as $Fe^{2+}$ or $OH^-$, producing subsequent non-radiative relaxation (and heat). The probability of this process increases with active-dopant concentration, and its effect on the upper manifold lifetime is given by:

$$\tau(N_0) = \frac{\tau_0}{1 + \frac{9}{2\pi}\left(\frac{N_0}{N_c}\right)^2} \quad (2)$$

where to $\tau_0 = 1/(\tau_{rad}^{-1} + \tau_{nr}^{-1})$ is the total lifetime at sufficiently low concentrations that concentration quenching has a negligible effect on the total lifetime, and $N_c$ is the critical concentration for which energy transfer to an impurity has the same probability as energy transfer to another cooling ion. The parameter $\tau_{nr}$ is the non-radiative relaxation from the metastable level 106 to the ground state 104.

The bracket in the right hand side of Eq. 1 is the term that can be negative (negative heat extracted from the medium, i.e., cooling). For this term to be negative, $h_{vp}$ must be larger than $h\langle\nu_f\rangle\tau(N_0)/\tau_{rad}$. When the concentration $N_0$ is low, and when nonradiative relaxation is negligible (infinite $\tau_{nr}$), $\tau(N_0) = \tau_{rad}$ and this condition becomes $h_{vp} < h\langle\nu_f\rangle$. For a given pump photon energy $h_{vp}$ and a given mean fluorescence energy $h\langle\nu_f\rangle$ (the latter depends only on the ion, its host, and its temperature), when $\tau(N_0) = \tau_{rad}$ the bracket term is as negative as can be. To increase the amount of heat that is extracted, the rest of the right hand side must be as large as possible. In particular the doped area must be large, the radiative lifetime must be as short as possible, and the ion concentration must be high. However, when $N_0$ is increased, $\tau(N_0)$ decreases and the bracket decreases in magnitude. If $N_0$ becomes comparable to $N_c$, $\tau(N_0)$ starts to decrease significantly, and the term in bracket, at some point, goes from negative to positive. Cooling is then no longer possible. There is clearly an optimum concentration $N_0$ that strikes a compromise between increased cooling (through the factor $N_0$ in the right hand side of Eq. 1) and decreased lifetime (through $\tau(N_0)$ in the bracket). This optimum concentration maximizes the heat extracted from the fiber. For $Yb^{3+}$ in a fluorozirconate fiber with a doped core radius of 3 μm pumped at 1020 nm, for example, this concentration was determined to be 2.1 wt. % Yb.

For a fiber with measurable background absorptive loss, an exact expression can be derived for the optimum pump power that must be launched into the fiber to maximize the heat extraction. Assuming a lossy fiber with an absorptive loss coefficient $\alpha_{ba}$ and neglecting the effect of the amplified spontaneous emission (ASE) that travels in the fiber, the optimum power for a single-moded pump is given by:

$$P_{p,opt} = P_{p,sat} \frac{-(2-\eta) + \sqrt{\eta^2 + 4(1-\eta)\frac{\sigma_p^a N_0}{\alpha_{ba}}\left(\frac{\tau}{\tau_{rad}}\frac{h\langle v_f \rangle}{hv_p} - 1\right)}}{2(1-\eta)} \quad (3)$$

where $P_{p,sat}$ is the saturation intensity of the transition at the pump wavelength and $\eta$ is the percentage of pump mode energy that is contained in the core. A similar expression can be derived for a multimode pump, assuming a top-hat mode distribution.

Equation (1) above shows that the maximum heat that can be extracted from the fiber per unit time and per unit length is proportional to the cross-sectional area $A_c$ of the fiber core. The majority of fiber lasers and fiber amplifiers utilize a fiber that carries either a single transverse mode, or just a few modes, in order to generate an output with a high spatial coherence. Such fibers, including conventional single-mode fibers and so-called large-mode-area fibers, have a relatively small diameter, of the order of approximately 7 microns for the former and typically less than 30 microns for the latter for operation at wavelengths around 1 micron. The core area $A_c$ can therefore only be increased up to a point if one also wishes to have a fiber laser or amplifier that produces a single transverse mode.

The above analysis shows that, for some prior-art ASF-cooling systems and a given cooling ion, therefore, only two parameters in a core-pumped fiber can be adjusted in practice to increase the amount of heat extracted, namely the core area and the active-dopant concentration. Unfortunately, there are physical limits for each of these parameters. As a result, the maximum heat that can be extracted from a core-pumped single-mode fiber using ASF is limited using these prior-art techniques.

If cooling originates from the relatively small core of a single-mode fiber, therefore, minimal cooling can be achieved and the output power of such a laser cannot exceed tens of watts without overheating.

It is an aspect of the present disclosure that the principle of ASF cooling can be more effectively applied to fiber-based gain elements, such as small-core fiber lasers and fiber amplifiers, by enabling ASF cooling in a cladding layer that surrounds the core of the fiber, and by arranging the fiber such that fiber sections that are hotter than the ambient environment are thermally coupled with fiber sections that are colder than the ambient environment. As a result, the barriers outlined above are overcome and significantly more heat can be extracted from the fiber, thereby enabling gain elements that can operate at significantly greater power levels than possible in the prior-art. It is particularly advantageous that this use of ASF cooling in a cladding layer, in addition to or instead of in the fiber core, enables greater cooling capability, since a cladding layer typically has greater volume that the core. It should be noted that, while embodiments are described herein with respect to controlling their temperature and thermal gradients relative to the temperature of their ambient environment, other temperature configurations are possible without departing from the scope of the present disclosure.

Furthermore, since embodiments in accordance with the present disclosure do not require external mechanical coolers, they enable fiber-based gain elements, such as fiber lasers, fiber amplifiers, and fiber laser/amplifier combinations, that have significant advantages over prior-art devices, such as:

i. smaller size; or
ii. vibration-free operation; or
iii. lack of a need for bulky heat sinks, water-based coolers, and/or expensive temperature controllers; or
iv. lower cost; or
v. a lack of moving parts; or
vi. improved output power stability; or
vii. improved frequency stability; or
viii. any combination of i, ii, iii, iv, v, vi, and vii.

FIG. 2A depicts a schematic drawing of a cross-sectional view of a cladding-pumped fiber laser in accordance with the present disclosure. Laser 200 includes fiber 202, first pump laser 204-1, second pump laser 204-2, and beam combiner 206, and fiber Bragg gratings 208-1 and 208-2.

It should be noted that, while the depicted example is a fiber-based gain element configured as a fiber laser, the teachings of the present disclosure are applicable to virtually any fiber-based gain element, such as fiber lasers, fiber amplifiers, fiber laser/amplifier combinations, and the like.

Fiber 202 and fiber Bragg gratings (FBG) 208-1 and 208-2 collectively define gain element 210, which provides output signal 214 in response to optical gain that occurs in fiber 202 in response to pump signal 212-1. Fiber 202 is characterized by longitudinal axis A1.

FIG. 2B depicts a schematic drawing of a cross-sectional view of fiber 202.

FIG. 2C depicts a schematic drawing of a side view of a coiled fiber-laser configuration suitable for mitigating temperature excursions along the length of a fiber-based gain element in accordance with the present disclosure. Arrangement 216 is a stacked-coil arrangement that is configured to reduce the operating temperature and thermal gradient along gain element 210 by thermally coupling hot sections and cold sections of fiber 202, as discussed in more detail below.

Fiber 202 includes core 220, inner cladding 222, central cladding 224, and outer cladding 226. Typically, fiber 202 is surrounded by additional structure (not shown), such as a protective jacket, and the like, to prevent physical damage to the fiber, as well as absorption of moisture that can damage the fiber over time.

Core 220 is a conventional optical-fiber core comprising host material 228, which is doped with dopant 230, which is an active dopant. For the purposes of this Specification, including the appended claims, the term "active dopant" is defined as a dopant that enables optical gain and/or anti-Stokes fluorescence. In similar fashion, the term "passive dopant" is defined as a dopant that does not substantially contribute to optical gain and/or anti-Stokes fluorescence. In the depicted example, dopant 230 is a trivalent rare-earth ion—specifically, trivalent ytterbium ($Yb^{3+}$). In some embodiments, dopant 230 is a different active dopant, such as a different rare-earth ion.

Inner cladding 222 is a cladding layer comprising host material 228 that is substantially active-dopant free. Inner cladding 222 surrounds core 220.

Central cladding 224 is a cladding layer that surrounds inner cladding 222. Central cladding 224 comprises host material 228, which is doped with dopant 232. In the depicted example, dopants 230 and 232 are the same dopant; however, in some embodiments, central cladding 224 is doped with a different dopant than is used for core 220.

Outer cladding 226 is a cladding layer comprising host material 228 that is substantially active-dopant free. Outer cladding 226 surrounds central cladding 224.

In the depicted example, host material 228 is zirconium barium lanthanum aluminum sodium fluoride (ZBLAN). In some embodiments, host material 228 is a different fluoride glass, such as zirconium barium lanthanum aluminum sodium lead fluoride (ZBLANP), and the like. In some embodiments, host material 228 is a different glass suitable for doping with a rare-earth ion and supporting optical gain.

As will be apparent to one skilled in the art, the choice of active and passive dopants used in one or more layers of fiber 202 is typically based on the type of host material used in the optical fiber or on the desired pump and laser (or amplifier) wavelengths.

Preferably, host material 228 is chosen to minimize non-radiative relaxation within the energy levels of the ions performing the cooling, and to also minimize the amount of concentration quenching between ions so that a large concentration of ions can be used, since higher ion concentrations typically enable greater heat extraction. It should be noted, however, that any suitable host material can be used without departing from the scope of the present disclosure. Alternative host materials suitable for use in embodiments in accordance with the present disclosure include, without limitation, fluorozirconate glasses, fluorophosphate glasses, phosphate glasses, telluride glasses, silicate glasses, germanate glasses, chalcogenide glasses, fused silica, other glasses, plastics, and the like.

It should also be noted that myriad active dopants suitable for use in core 220 and central cladding 224 are within the scope of the present disclosure. Alternative rare-earth ions suitable for use as an active dopant in accordance with the present disclosure include, without limitation, trivalent erbium ($Er^{3+}$), trivalent thulium ($Tm^{3+}$), trivalent neodymium ($Nd^{3+}$), non-trivalent rare-earth metals, erbium, neodymium, thulium, praseodymium, and holmium, transition-metal ions, nanoparticles, and the like.

First and second pump lasers 204-1 and 204-2 are conventional pump sources, such as pump lasers. First pump laser 204-1 provides pump signal 212-1, which has first wavelength, $\lambda 1$, and is optically coupled into core 220 via injection into inner cladding 222. In the depicted example, $\lambda 1$ is approximately 985 nm. In some embodiments, pump signal 212-1 is optically coupled directly into core 220.

Second pump laser 204-2 provides pump signal 212-2, which has second wavelength, $\lambda 2$, and is injected directly into central cladding 224. In the depicted example, $\lambda 2$ is approximately 1030 nm.

First wavelength, $\lambda 1$, is selected to excite the ions of dopant 230 in core 220 to emit at laser wavelength, $\lambda L$, thereby generating output 214. Second wavelength, $\lambda 2$, is selected to excite ASF in the ions of dopant 232 in central cladding 224 to realize cooling. In order to produce a significant optical gain at laser wavelength, $\lambda L$, (which is often shorter than the mean fluorescence wavelength, as mandated by many laser and amplifier applications), first wavelength, $\lambda 1$, is typically shorter than that of the fluorescence so that the energy of the photons of pump signal 212-1 is higher than the mean energy $h\langle v_f \rangle$ of the fluorescence photons. Conversely, in order to extract a significant amount of heat from the second cladding, thus cooling fiber 202, second wavelength, $\lambda 2$, is selected such that its photons have lower energy than the mean energy of the fluorescence photons. However, in some embodiments, the first and second wavelengths are both longer than the mean energy of the fluorescence photons.

Beam combiner 206 is a conventional optical multiplexer, such as a fiber-based beam combiner, a planar lightwave circuit (PLC), and the like.

Each of FBG 208-1 and 208-2 is a conventional fiber Bragg grating written into core 220. FBG 208-1 and 208-2 collectively define a resonant cavity within fiber 202. In some embodiments, at least one of FBG 208-1 and 208-2 is written into a separate fiber that is optically coupled with fiber 202. In some embodiments, fiber 202 includes a resonant cavity that comprises at least one free-space element, such as a dielectric reflector, etc.

Inner cladding 222 and central cladding 224 are configured such that the central cladding has a lower refractive index than that of the inner cladding, which has a lower refractive index than core 220. As a result, core 220 and inner cladding 222 function as a waveguide that guides first pump signal 212-1 (in analogous fashion to that of a conventional cladding-pumped fiber laser or fiber amplifier). First pump signal 212-1 is launched into inner cladding 222 and propagates through it without being substantially absorbed by dopant 232 in central cladding 224. It should be noted that some of the light of first pump signal 212-1 in inner cladding 222 exists as an evanescent tail that extends slightly into central cladding 224; however, these modes are weakly absorbed (if at all) by the dopant ions in the central cladding. As a result, such absorption is considered insignificant for the purposes of this Specification.

In similar fashion, outer cladding 226 is configured such that it has a lower refractive index than that of central cladding 224. As a result, central cladding 224 functions as a waveguide for second pump signal 212-2.

The desired refractive index configuration of fiber 202 is typically established by doping one or more of inner cladding 222, central cladding 224, and outer cladding 226 with passive dopant atoms in conventional fashion.

By virtue of this fiber structure, second pump signal 212-2 is coupled into core 220, inner cladding 222, and central cladding 224, which collectively function as a single multimode waveguide. This enables absorption of the second pump by dopant 230, which cools fiber laser 200.

In some embodiments, the percentage of the first pump power absorbed per unit length by the rare-earth ions in the core is small compared to the percentage of pump power absorbed per unit length by the rare-earth ions in the central cladding. The length of the fiber must therefore be chosen accordingly, such that a sufficient percentage of the first pump power is absorbed by the ions in the core and a sufficient percentage of the second pump power is absorbed by the ions in the central cladding.

In some embodiments, a second beam combiner couples additional pump signals 212-1 and 212-2 into fiber 202 at the opposite end such that fiber 202 is pumped from both ends. As a result, in some such embodiments, hot portion 202H is located between two cold portions 202C. However, in some embodiments, such as when signals 212-1 and 212-2 are the same signals, cold portion 202C is located between two hot portions 202H.

It should be noted that many thermal configurations in fiber 202 are possible, depending upon the manner in which it is pumped. In some embodiments, pump signal 212-1 attenuates more quickly than pump signal 212-2 as they propagate along the length of fiber 202, creating a different distribution of hot and cold portions. In some embodiments, pump signal 212-2 is provided such that central cladding 224 is initially overpumped, resulting in a hot portion between beam combiner 206 and cold portion 202C.

It should be noted that the inclusion of undoped inner cladding 222 affords embodiments in accordance with the present disclosure significant advantages over prior-art ASF-cooled fiber-based gain elements. These benefits depend, in some part, on the manner in which laser 200 is pumped and the manner in which the core and central cladding are doped, however.

For example, the inclusion of inner cladding 222 enables fiber laser 200 to be cladding pumped with pump signal 212-1 without incurring significant absorption of the pump-signal energy in central cladding 224.

In addition, for a cladding-pumped laser, the inclusion of inner cladding 222 enables fiber 202 to be designed to realize any practical amount of cooling without having to compromise the optical gain that can be developed in core 220.

In some embodiments, core 220 is pumped by direct injection of pump signal 212-1, rather than via cladding pumping. When pump signal 212-1 has a wavelength shorter than the mean fluorescence wavelength of the central cladding dopant 232, as in the depicted example, any spatial overlap of the evanescent field of pump signal 212-1 and central cladding 224 would give rise to undesirable internal heat generation in the absence of inner cladding 222. By including a cladding layer having a lower refractive index than core 220 (i.e., inner cladding 222) between the core and central cladding 224, however, incursion of pump signal 212-1 into central cladding 224 can be significantly decreased or eliminated entirely. This mitigates spatial overlap between pump signal 212-1 and central cladding 224, thereby enabling higher output power for laser 200.

It should be noted that it is preferable to configure inner cladding 222 with as high a numerical aperture (NA) as possible to substantially minimize the amount of the pump power of pump signal 222-1 that reaches evanescently into central cladding 224.

In some cases, different sections of a fiber-based gain element have markedly different temperatures even when the net heat generated along the entire fiber is approximately zero, because such elements have long lengths and small transverse dimensions that limit thermal conduction along their length. Furthermore, as pump signal 212-2 propagates along length L0 of fiber 202, it becomes attenuated. As a result, the further it gets from beam combiner 206, the less pump signal 212-2 is available to induce ASF cooling and the temperature of fiber 202, therefore, typically increases as a function of distance from beam combiner 206.

It is an aspect of the present invention that the temperature difference between different fiber portions of the same fiber-based gain element can be exploited to facilitate mitigation of its internal heat generation.

In the depicted example, fiber 202 includes fiber portions 202C and 202H. Fiber portion 202C has length LC and outer surface OS-C. Fiber portion 202H has length LH and outer surface OS-H. Because it exhibits more ASF cooling than heating along length LC, the temperature of fiber portion 202C is lower than that of the ambient environment that surrounds the fiber. Along length LH of fiber portion 202H, however, fiber 202 exhibits more heating than cooling and, therefore, its temperature is higher than that of the ambient environment.

As depicted in FIG. 2C, arrangement 216 is a stacked configuration of fiber 202 in which the fiber is wound around mandrel 234. Each complete turn of fiber portion 202C about mandrel 234 defines a cold winding 218C. In similar fashion, each complete turn of fiber portion 202H about mandrel 234 defines a hot winding 218H.

Windings 218C and 218H are arranged such they are interleaved along the height of mandrel 234. As a result, the outer surface OS-H of each hot winding is in at least partial physical contact with the outer surface OS-C of a cold winding, which enables heat exchange between the hot and cold windings through their outer surfaces. As indicated, heat flow 236 propagates from hot portion 202H into cold portion 202C through outer surfaces OS-H and OS-C of adjacent windings along directions that are unaligned with the longitudinal axis of fiber 202. In some embodiments, a thermally conductive material, such as thermal paste, is included (typically, as an outer coating for the coil and/or between the winding regions) to enhance thermal coupling between adjacent sections. Configuration 216 enables an entire fiber to reach thermal equilibrium with a much smaller temperature excursion along its length than an uncoiled fiber.

Figure 3:
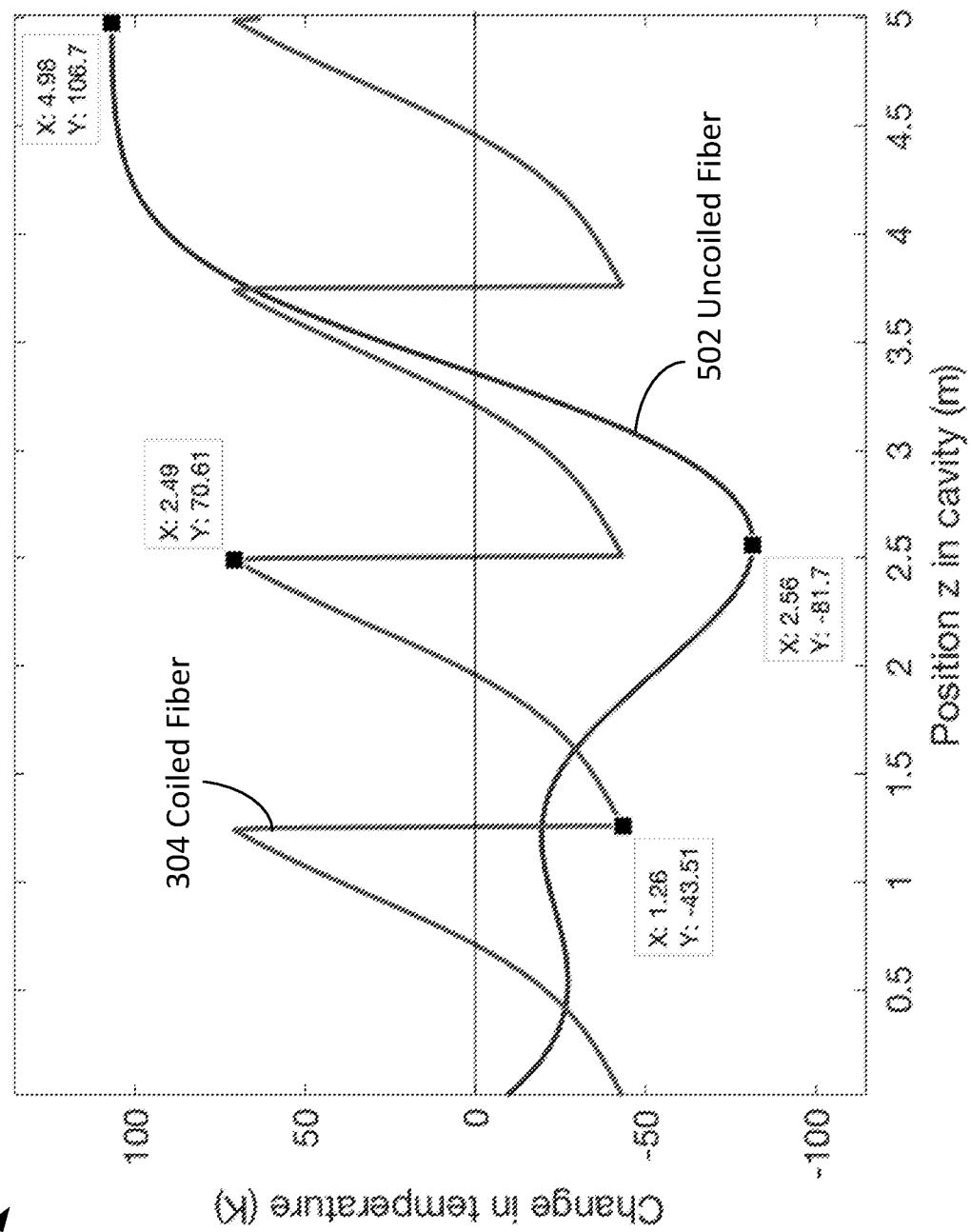
FIG. 3 depicts plots of the temperature distribution along the length of a cladding-cooled fiber laser in uncoiled and coiled configurations of stack 216.

FIG. 3 depicts plots of the temperature distribution along the length of a cladding-cooled fiber laser in uncoiled and coiled configurations of stack 216. Plot 500 shows the simulated heat distribution in a fiber laser at approximately 965 W of emitted optical power.

Trace 302 depicts the temperature distribution of the uncoiled fiber laser configuration. When the temperature distribution is integrated along the length of its fiber, the fiber laser has a zero net temperature change. However, while the temperature excursion within the fiber is significantly smaller than an uncooled fiber laser under similar conditions, the temperature difference between its coldest point (−81.7 K) and hottest point (106.7 K) is approximately 188 degrees, which will lead to degraded performance.

Trace 304 depicts the temperature distribution of stack 216, where stack 216 includes four windings. In the coiled configuration, the fiber laser has a temperature difference between its coldest point (−43.5 K) and hottest point (70.6 K) of only about 114 degrees along its length.

It should be noted that stack 216 is merely one of myriad coil configurations that can be used to reduce the temperature excursions along the length of a fiber-based gain element.

Figure 4A:
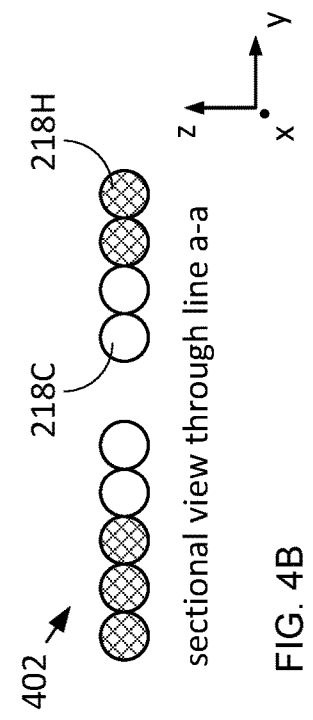
FIGS. 4A-B depict schematic drawings of top and sectional views, respectively, of an alternative coiled fiber-laser configuration in accordance with the present disclosure.
Figure 4C:
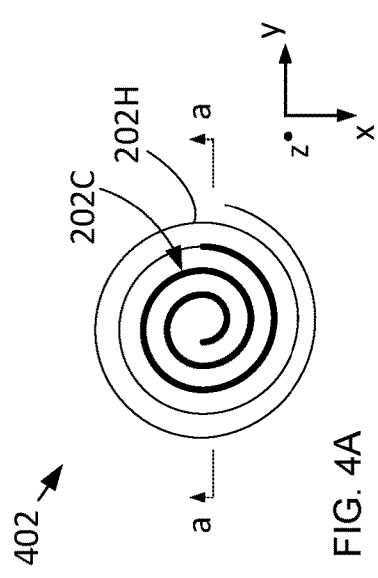
FIG. 4C depicts a schematic drawing of a sectional view of another alternative coiled fiber-laser configuration in accordance with the present disclosure.
Figure 4D:
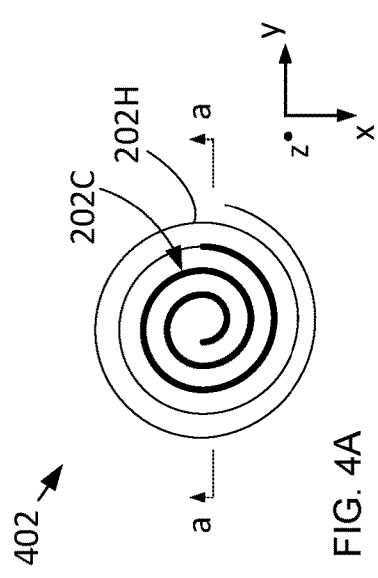
FIG. 4D depicts a schematic drawing of a sectional view of yet another alternative coiled fiber-laser configuration in accordance with the present disclosure.
Figure 4B:
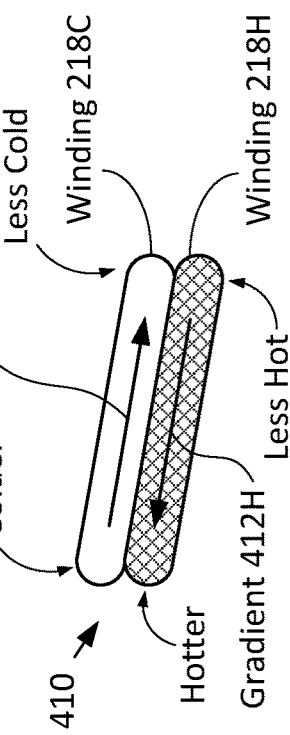

FIGS. 4A-B depict schematic drawings of top and sectional views, respectively, of an alternative coiled fiber-laser configuration in accordance with the present disclosure. The view depicted in FIG. 4B is taken through line a-a as seen in FIG. 4A. Configuration 402 is a flat coil configuration that includes an inner coil region comprising cold windings 218C of fiber portion 202C and an outer coil region comprising hot windings 218H of fiber portion 202H.

FIG. 4C depicts a schematic drawing of a sectional view of another alternative coiled fiber-laser configuration in accordance with the present disclosure. Configuration 404 is an example of a multi-layer "close-packed" configuration. It should be noted that, in configuration 404, a large portion of the circumference of the hot and cold fiber portions are in close proximity, thereby enabling a large amount of heat exchange between them.

FIG. 4D depicts a schematic drawing of a sectional view of yet another alternative coiled fiber-laser configuration in accordance with the present disclosure. Configuration 406 is an example of a "non-close-packed" configuration. It should be noted that less of the circumference of the hot and cold sections are in close proximity; therefore, less heat is exchanged in configuration 406 than in configuration 404.

Figure 4E:
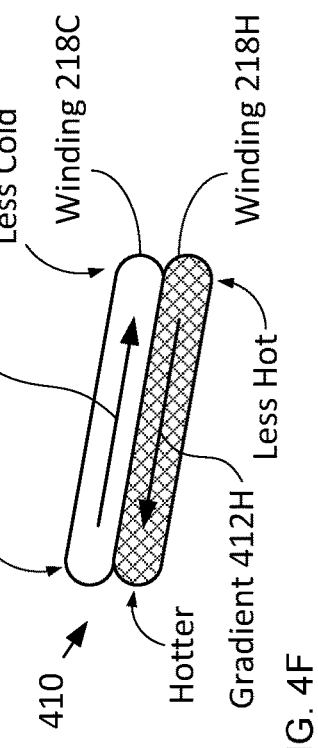
FIG. 4E depicts a schematic drawing of still another fiber-laser configuration in accordance with the present disclosure. Configuration 408 is an example of a helically twisted, flat-coil configuration.

FIG. 4E depicts a schematic drawing of still another fiber-laser configuration in accordance with the present disclosure. Configuration 408 is an example of a helically twisted, flat-coil configuration.

Figure 4F:
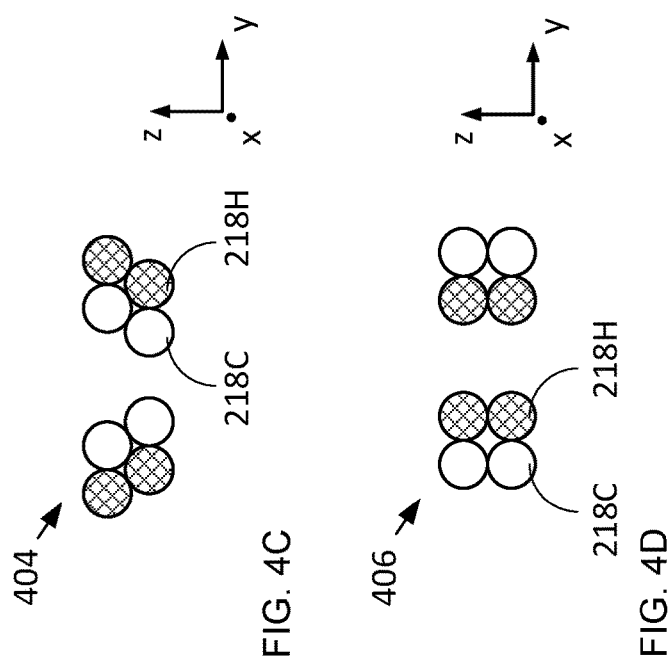
FIG. 4F depicts a schematic drawing of a portion of another fiber-laser configuration in accordance with the present disclosure.

FIG. 4F depicts a schematic drawing of a portion of another fiber-laser configuration in accordance with the present disclosure. Configuration 410 is an example of a coiled configuration in which hot windings 218H and cold windings 218C are arranged such that their respective thermal gradients are inverted.

Hot winding 218H is characterized by thermal gradient 412H, which extends from a less hot region to a hotter region, as indicated.

In similar fashion, cold winding 218C is characterized by thermal gradient 412C, which extends from a cold region to a less cold region, as indicated.

In configuration 410, adjacent hot and cold windings are arranged such that their thermal gradients are opposed to one another. As a result, the hottest portion of hot winding 218H is in substantially direct contact with the coldest portion of cold winding 218C, while the least hot portion of hot winding 218H is in substantially direct contact with the least cold portion of cold winding 218C; therefore, configuration 410 gives rise to a substantially uniform distribution of temperature over the length of fiber 202.

It should be noted that, while the depicted example includes an optical fiber having a fiber configuration having inner, central, and outer claddings, a fiber arrangement in accordance with the present disclosure can include an optical fiber having virtually any fiber configuration. However, the concepts disclosed herein are particularly well suited for use with a fiber-based gain element having one or more first portions that are cooled below a first temperature via ASF cooling and at least one second portion in which internal heat generation raises its temperature above that of the first temperature.

Figure 5:
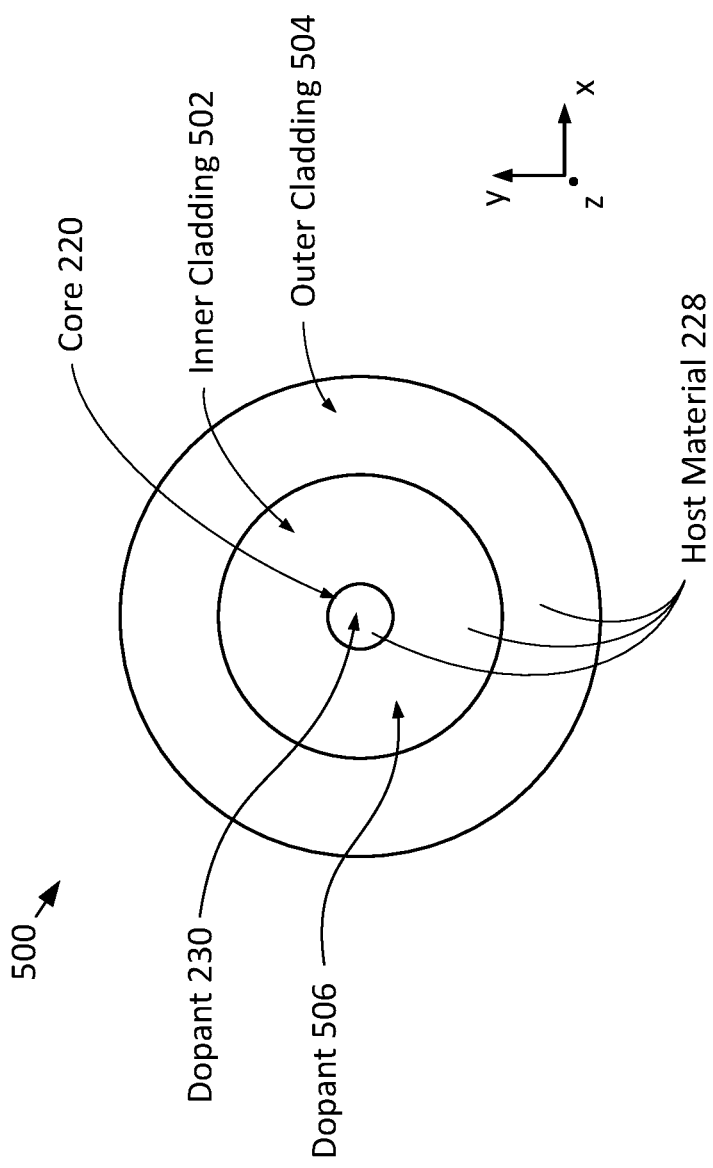
FIG. 5 depicts a schematic drawing of a cross-sectional view of an alternative embodiment of a fiber suitable for use in accordance with the present disclosure.

FIG. 5 depicts a schematic drawing of a cross-sectional view of an alternative embodiment of a fiber suitable for use in accordance with the present disclosure. Fiber 500 is a double-clad optical fiber that includes core 220, inner cladding 502, and outer cladding 504. Fiber 500 is particularly well suited for use in a fiber laser, fiber amplifier, fiber laser/amplifier combination and the like.

As described above, core 220 comprises host material 228, which is doped with dopant 230. In some embodiments, fiber 500 includes a core that is configured differently than core 220.

Inner cladding 502 surrounds core 220 and is configured such that it has a refractive index that is lower than that of the core. As a result, core 220 and inner cladding 502 function as a waveguide. Inner cladding 502 also comprises host material 228 and is doped with an active dopant (i.e., dopant 506). In the depicted example, each of dopants 230 and 506 is trivalent ytterbium; however, in some embodiments, dopant 506 and dopant 230 are different dopants.

Outer cladding 504 is a cladding layer comprising host material 228, which is substantially undoped with active dopant. Outer cladding 504 surrounds inner cladding 502 and is configured such that it has a refractive index that is lower than that of the inner cladding. As a result, inner cladding 502 and outer cladding 504 also form an optical waveguide.

In the depicted example, fiber 500 is pumped with a single pump (not shown) having wavelength, λ5, which is coupled at one end of the fiber into both core 220 and inner cladding 502. Wavelength, λ5, is selected such that it excites dopants 230 and causes them to exhibit gain via stimulated emission, and such that it also excites dopants 506 in inner cladding 502 and causes them to cool the fiber via ASF.

Specifically, this pump wavelength excites dopants 506, which exhibit ASF and cool the first cladding. This same wavelength also excites dopants 230, which produce gain and generate waste heat in core 220. The heat generated in core 220 travels radially across the fiber towards its outer surface. In the absence of ASF cooling, the heat generated in fiber 500 would be removed from the fiber by convection in the ambient environment surrounding the fiber. In the depicted example, however, the heat is removed from inner cladding 502 via ASF. It should be noted that as this heat is removed, it is rapidly replenished by additional heat that flows into inner cladding 502 from core 220, as well as by heat that flows into the fiber from the surrounding air (or through a surrounding jacket) through outer cladding 504.

In the depicted example, the concentrations of the dopants 230 and 506, the area $A_c$ of the core, the area $A_1$ of the first cladding, and the pump power launched into the structure, are all selected such that the net heat generated in the fiber is as close to zero as possible at all positions along the fiber. However, since it is difficult to achieve perfect cancellation at all positions, these parameters are typically chosen to minimize the average heat generated along the entire fiber length and coiling techniques described in the present disclosure are used to further reduce the temperature gradient along the length of the fiber. It should be noted, however, that the teachings of the present disclosure enable extraction of significantly more heat per unit time and per unit length from fiber 500 than can be achieved using prior-art techniques because it is possible to select inner cladding 502 such that it is considerably larger than core 220.

In some embodiments, core 220 and inner cladding 502 are pumped with separate pumps, each providing light at a different wavelength. In such embodiments, the pump guided by core 220 has a wavelength, λ4, which creates gain at the wavelength to be amplified by dopants 230, while the wavelength, λ5, of the pump that excites dopants 506 is chosen to produce cooling via ASF in inner cladding 502 and, preferably, substantially maximize the amount of heat extracted in the process.

The amount of heat generated in core 220 depends on many parameters, and typically increases as the pump power launched into it increases. The amount of heat extracted from inner cladding 502 is proportional to its cross-sectional area, as indicated by Eq. 1 above. Typically, therefore, the diameter of inner cladding 502 is selected such that the extracted heat offsets the heat generated in core 220. Selection of the diameter of inner cladding 502 enables control over the amount of the extracted heat independently of the size of core 220.

Typically, the diameter of inner cladding 502 (and the power launched into it) is selected based on the amount of heat that must be removed from the fiber. For example, a very large first cladding can be selected in order to maintain near room temperature for a fiber laser that produces a high output power. This technique enables the creation of compact, highly stable fiber lasers with increased output power, as compared to prior-art fiber lasers of comparable size and quality.

In some embodiments, a single pump at wavelength $\lambda 6$ is launched into the inner cladding such that it simultaneously induces optical gain in the core and ASF cooling in the inner cladding. In this embodiment, the size of the inner cladding must be optimized to maximize gain in the core, while allowing for sufficient ASF cooling in the cladding. In should be noted that pump wavelength $\lambda 6$ is chosen to be longer than the mean fluorescent wavelength of dopant 506 while still creating gain at the wavelength to be amplified by dopants 230.

In some embodiments, core 220 has a large diameter and fiber 500 is a large-mode-area fiber.

It should be further noted that if a fiber core is pumped with a large amount of pump power at $\lambda 4$ to produce a large gain (in the case of an amplifier) or a high output power (in the case of a high-power fiber laser), then a cladding-pumped configuration is typically preferable. If dopant 506 in inner cladding 502 interferes with the proper propagation of the pump at $\lambda 4$ (for example, if dopant 506 absorbs the pump at $\lambda 4$), and $\lambda 4$ is shorter than the mean fluorescent wavelength of dopant 506, then the pump coupled into inner cladding 502 will cause heating in inner cladding 502, negating the attempt of the second pump at wavelength $\lambda 5$ to induce cooling in inner cladding 502. This can be the case, for example, if dopants 230 and 506 are the same. The embodiments described in relation to FIG. 2, in which the pump at $\lambda 4$ substantially does not overlap spatially with the medium that performs the cooling, i.e., the central cladding.

In a cladding-pumped fiber laser or amplifier, such as described above and with respect to FIG. 5, the pump at $\lambda 4$ is coupled into the first cladding. Because the pump cladding modes spatially overlap with the pump core mode, this pump power is gradually absorbed by dopants 230 to give rise to gain in core 220. As a result, it is preferable that inner cladding 502 is free of dopants that absorb at the pump wavelength $\lambda 4$. In the depicted example, therefore, dopant 506 is typically selected such that it does not absorb pump wavelength $\lambda 4$. In some embodiments, absorption of pump wavelength $\lambda 4$ is mitigated by selecting different dopants for dopants 230 and 506.

It should be noted that a fiber structure analogous to that of fiber 202, described above and with respect to FIGS. 2A-B, inherently mitigates such absorption.

Figure 6:
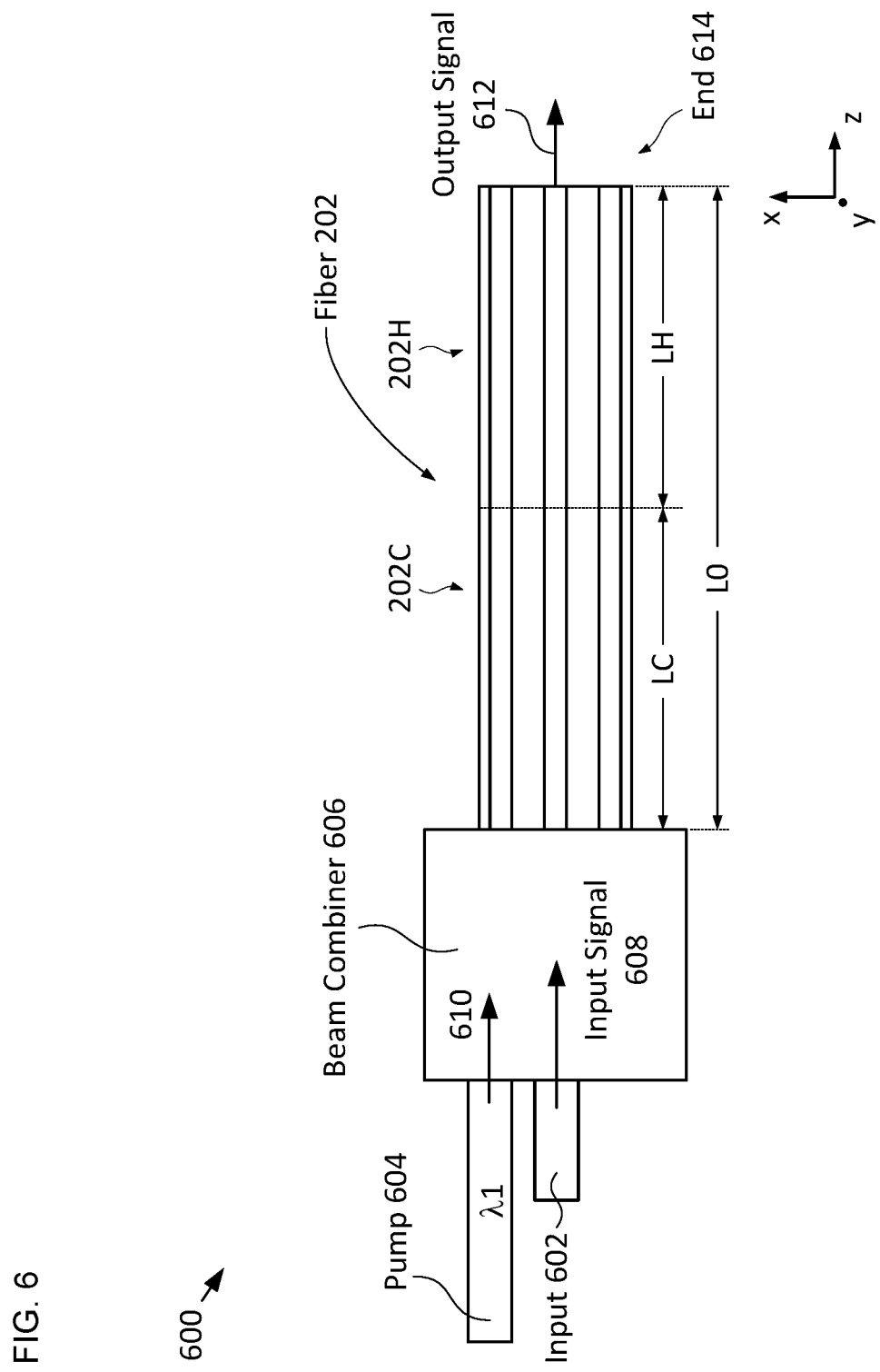
FIG. 6 depicts a schematic drawing of a fiber amplifier in accordance with the present disclosure.

FIG. 6 depicts a schematic drawing of a fiber amplifier in accordance with the present disclosure. Amplifier 600 is a fiber amplifier that includes fiber 202, input 602, pump laser 604, and beam combiner 606. Amplifier 600 is analogous to fiber laser 200 described above; however, amplifier 600 does not include fiber-Bragg gratings in fiber 202. Amplifier 600 is configured to receive input signal 608 and amplify it to provide higher-intensity output signal 612.

Input 602 is a conventional input port for optically coupling input signal 608 into beam combiner 606.

In this embodiment, a single pump laser (i.e., pump laser 604) is launched into the central cladding. The wavelength of pump laser 604 is chosen to simultaneously induce gain in the core 220 and ASF cooling in the central cladding 224.

Conventional beam combiner 606, therefore, is configured for receiving input signal 608 and optically coupling it into the core of fiber 202, while also coupling pump signal 610 into both core 220 and central cladding 224.

In some embodiments, a second pump signal 610 is coupled into end 614 of fiber 202 to reduce the temperature gradient along the length of the fiber.

In some embodiments, core 220 and central cladding 224 are pumped with different pump wavelengths and beam combiner 606 includes another pump port for enabling injection of a second pump signal for pumping the core.

As noted above, fiber 202 is configured to provide optical gain for input signal 608 as it propagates along the length, L0, of the fiber, as well as ASF cooling in fiber portion 202C. Furthermore, in accordance with the present disclosure, fiber 202 is typically arranged in a coiled and/or twisted arrangement, such as those depicted in FIGS. 2C and 4A-E, to mitigate internally generated heat during operation. As a result, fiber amplifier 600 can provide output signal 612 such that it has higher optical power without some of the problems associated with prior-art fiber amplifiers.

It is to be understood that the disclosure teaches just some examples of the illustrative embodiment and that many variations of the invention can easily be devised by those skilled in the art after reading this disclosure and that the scope of the present invention is to be determined by the following claims.

What is claimed is:

1. A fiber-based gain element comprising an optical fiber having a longitudinal axis, a first portion having a first outer surface, and a second portion having a second outer surface, the optical fiber including:
   a core configured to provide optical gain in response to a first pump signal; and
   a first cladding that surrounds at least a portion of the core, the first cladding configured to exhibit anti-Stokes fluorescence (ASF) in response to a second pump signal, wherein the ASF removes heat from the first cladding;
   wherein the optical fiber is arranged such that the first outer surface and the second outer surface are thermally coupled; and
   wherein, when the core receives the first pump signal and the first cladding receives the second pump signal:
   (i) the first cladding and core are a thermally coupled such that heat flows from the core into the first cladding;
   (ii) the first portion has a temperature that is lower than a first temperature and a second portion having a temperature that is higher than the first temperature; and
   (iii) heat flows from the second portion to the first portion through the first and second surfaces along a direction that is unaligned with the longitudinal axis.

2. The element of claim 1 wherein the core comprises a first active dopant and the first cladding comprises a second active dopant.

3. The element of claim 2 wherein the first and second active dopants are the same active dopant.

4. The element of claim 1 further comprising second cladding that surrounds at least a portion of the core, the second cladding being between the core and the first cladding, wherein the core has a first refractive index, the first cladding has a second refractive index, and the second cladding has a third refractive index that is lower than the first refractive index and higher than the second refractive index.

5. The element of claim 4 further comprising a third cladding that surrounds at least a portion of the first cladding, the first cladding being between the third cladding and the second cladding, wherein the third cladding has a fourth refractive index that is lower than the second refractive index.

6. The element of claim 1 wherein the optical fiber is arranged in a first arrangement in which the first portion includes a first winding and the second portion includes a second winding, the first winding and second winding being adjacent and thermally coupled through the first and second outer surfaces.

7. The element of claim 1 wherein the first portion includes a plurality of first windings and the second portion includes a plurality of second windings, and wherein the first and second windings are arranged in a close-packed arrangement in which each second winding of the plurality thereof is thermally coupled with at least one first winding of the plurality thereof.

8. The element of claim 1 further comprising a first material that is thermally conductive, wherein the first material is thermally coupled with each of the first outer surface and the second outer surface.

9. The element of claim 1 further comprising the first pump and the second pump, and wherein the fiber-based gain element, first pump, and second pump collectively define an element selected from the group consisting of a fiber laser, a fiber amplifier, and a fiber laser/amplifier combination.

10. The element of claim 1 wherein at least one of the core and the first cladding comprises a host material that is a fluoride glass selected from the group consisting of zirconium barium lanthanum aluminum sodium fluoride (ZBLAN) and zirconium barium lanthanum aluminum sodium lead fluoride (ZBLANP).

11. The element of claim 1 wherein the first pump signal and second pump signal are the same pump signal.

12. A method comprising:
providing a fiber-based gain element comprising an optical fiber having a longitudinal axis, the optical fiber including a first portion having a first outer surface and a second portion having a second outer surface, the optical fiber comprising:
(i) a core that is configured to provide optical gain in response to a first pump signal; and
(ii) a first cladding that is configured to exhibit anti-Stokes fluorescence (ASF) in response to a second pump signal, wherein the first cladding is configured such that the ASF removes heat from the first cladding;
wherein the first cladding and core are thermally coupled such that heat flows from the core into the first cladding when the core receives the first pump signal and the first cladding receives the second pump signal;
arranging the optical fiber in a first arrangement in which the first outer surface and second outer surface are thermally coupled and heat flows between the first portion and second portion through the first and second outer surfaces along a direction that is unaligned with the longitudinal axis when the core receives the first pump signal and the first cladding receives the second pump signal;
optically coupling the first pump signal into the core; and
optically coupling the second pump signal into the first cladding.

13. The method of claim 12 further comprising:
providing the fiber-based gain element such that the core comprises a first host material doped with a first active dopant; and
providing the fiber-based gain element such that the first cladding comprises a second host material that is doped with a second active dopant.

14. The method of claim 13 wherein the first and second active dopants are the same active dopant.

15. The method of claim 12 further comprising providing the fiber-based gain element such that it further includes a second cladding that is located between the core and the first cladding, wherein the core has a first refractive index, the first cladding has a second refractive index, and the second cladding has a third refractive index that is lower than the first refractive index and higher than the second refractive index.

16. The method of claim 15 further comprising providing the fiber-based gain element such that it further includes a third cladding that surrounds at least a portion of the first cladding, wherein the third cladding has a first refractive index that is lower than the second refractive index.

17. The method of claim 12 wherein the first arrangement arranges the first and second portions such that:
the first portion includes at least one first winding;
the second portion includes at least one second winding;
the at least one first winding includes a first region of the first outer surface;
the at least one second winding includes a second region of the second outer surface; and
the first region and second region are thermally coupled.

18. The method of claim 12 wherein the first arrangement arranges the first and second portions such that:
the first portion includes a plurality of first windings;
the second portion includes a plurality of second windings; and
the first and second windings are arranged in a close-packed arrangement in which each second winding of the plurality thereof is thermally coupled with at least one first winding of the plurality thereof.

19. The method of claim 12 further comprising providing a first material that is thermally conductive, wherein the first material is provided such that it is thermally coupled with each of the first outer surface and the second outer surface.

20. The method of claim 12 further comprising providing the first pump and the second pump, and wherein the fiber-based gain element, first pump, and second pump collectively define an element selected from the group consisting of a fiber laser, a fiber amplifier, and a fiber laser/amplifier combination.

21. The method of claim 12 further comprising providing the fiber-based gain element such that at least one of the core and the first cladding comprises a host material that is a fluoride glass selected from the group consisting of zirconium barium lanthanum aluminum sodium fluoride (ZBLAN) and zirconium barium lanthanum aluminum sodium lead fluoride (ZBLANP).

22. The method of claim 12 further comprising providing the first pump signal and second pump signal as the same pump signal.

* * * * *